(12) United States Patent
Ruth

(10) Patent No.: US 7,395,933 B2
(45) Date of Patent: Jul. 8, 2008

(54) CARRIER TO HOLD SEMICONDUCTOR DEVICE USING OPPOSED ROLLERS

(75) Inventor: John D. Ruth, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 528 days.

(21) Appl. No.: 11/152,748

(22) Filed: Jun. 14, 2005

(65) Prior Publication Data

US 2006/0278977 A1     Dec. 14, 2006

(51) Int. Cl.
*B65D 85/48* (2006.01)

(52) U.S. Cl. ............... 206/724; 206/454; 248/309.1

(58) Field of Classification Search ............ 206/701, 206/706, 710, 722, 724, 453, 454, 560, 565, 206/586, 591, 592; 220/737; 248/311.2, 248/312.1, 309.1, 154; 257/726
See application file for complete search history.

(56) References Cited

U.S. PATENT DOCUMENTS

| | | | | |
|---|---|---|---|---|
| 4,535,887 A | * | 8/1985 | Egawa | 206/724 |
| 4,901,853 A | * | 2/1990 | Maryatt | 206/722 |
| 5,593,040 A | * | 1/1997 | Shelton et al. | 206/706 |
| 5,725,100 A | * | 3/1998 | Yamada | 206/710 |
| 5,960,959 A | * | 10/1999 | Wu et al. | 206/710 |
| 2004/0118860 A1 | * | 6/2004 | Leopold et al. | 220/737 |

* cited by examiner

*Primary Examiner*—Luan K Bui
(74) *Attorney, Agent, or Firm*—Buckley, Maschoff & Talwalkar LLC

(57) ABSTRACT

A carrier for a semiconductor device includes a body having an opening formed therein to receive the semiconductor device and a pair of rollers to hold the semiconductor device between the rollers in the opening.

8 Claims, 11 Drawing Sheets

CARRIER TO HOLD SEMICONDUCTOR DEVICE USING OPPOSED ROLLERS

BACKGROUND

When handling semiconductor devices such as microprocessors for the purpose of installing the devices in a test fixture, it is known to use carriers. A semiconductor device may be temporarily inserted in a carrier. The carrier and the device to be tested are transported to a test fixture such as a test interface unit (TIU) and the device, while still held in the carrier, is interfaced to the text fixture. After the necessary test procedure is performed, the carrier and the device are transported away from the test fixture, and the device is then removed from the carrier.

In a known type of carrier, an edge or lip on the carrier contacts the bottom of the device to retain the device within an opening formed in the carrier to receive the device. With a carrier of this type, certain areas or zones on the bottom of the device package must be kept free of contacts so as not to interfere with the handling of the device via the carrier. Such an arrangement, however, adversely affects the pin-count that may be provided on the device package.

DETAILED DESCRIPTION

Figure 1:
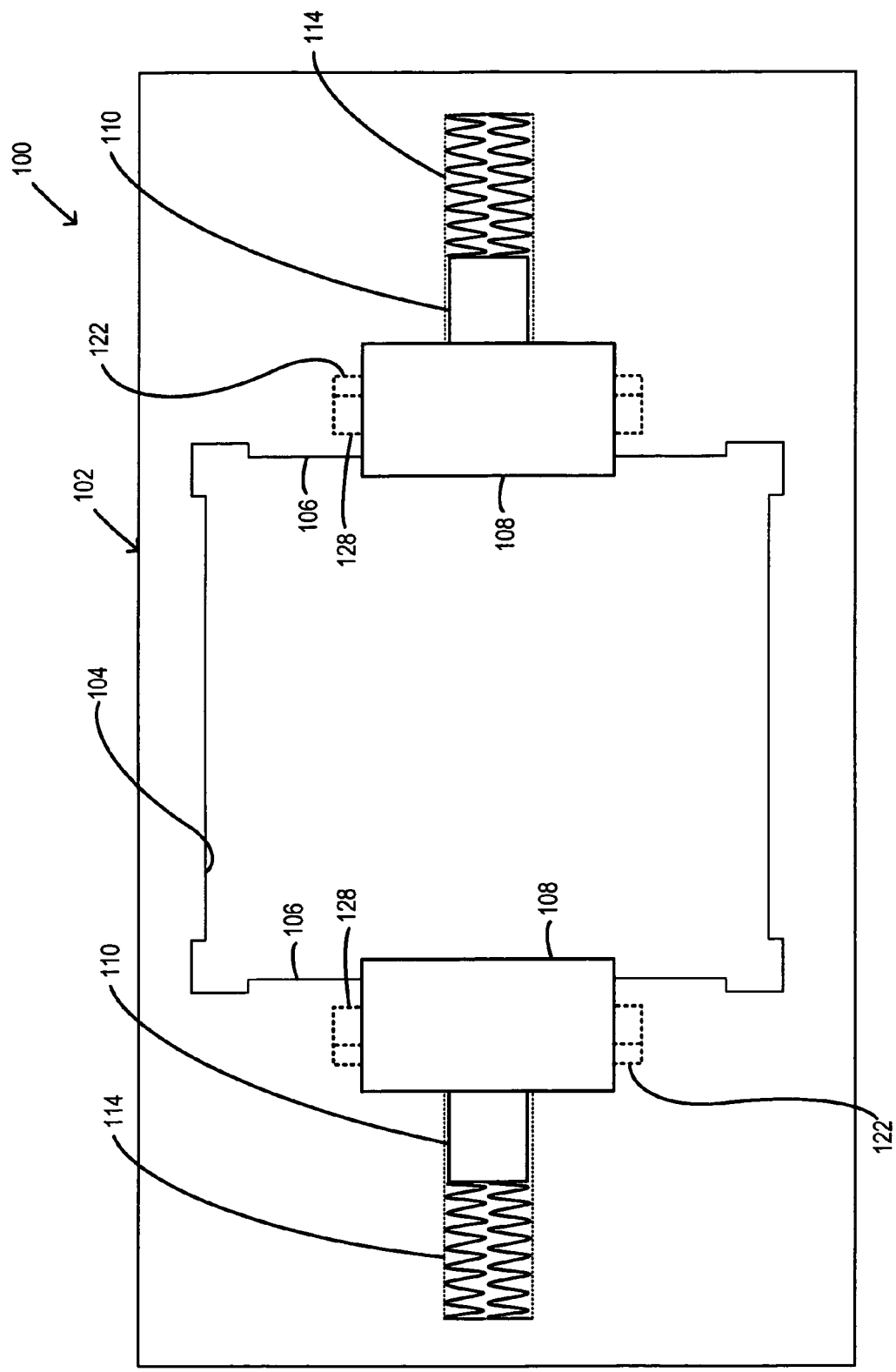
FIG. 1 is a schematic cross-sectional plan view of a carrier suitable for use in transporting a semiconductor device to and from a test fixture.
Figure 2:
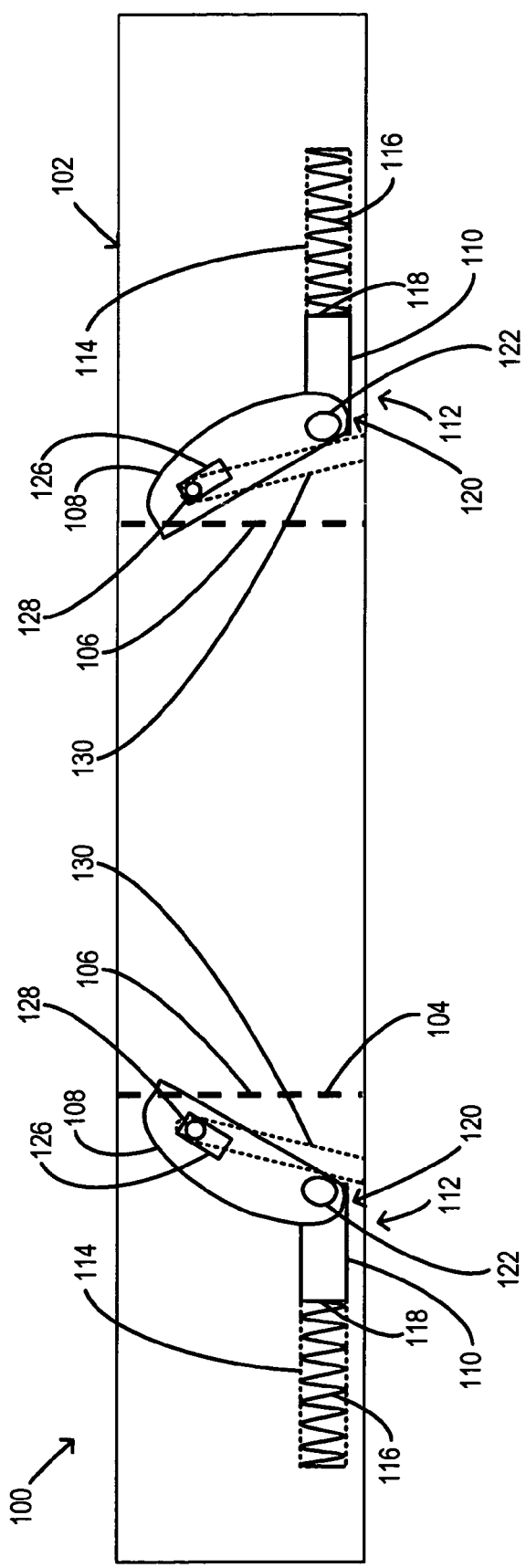
FIG. 2 is a schematic side cross-sectional view of the carrier of FIG. 1.

FIG. 1 is a schematic cross-sectional plan view of a carrier 100 suitable for use in transporting a semiconductor device (not shown in FIG. 1) to and from a test fixture (not shown in FIG. 1). FIG. 2 is a side cross-sectional view of the carrier 100.

The carrier 100 includes a generally planar body 102. The body 102 has an opening 104 formed at a central location in the body 102. The opening 104 is shaped and sized to substantially match the horizontal profile of the package of the semiconductor device to be received by the carrier 100. Thus the opening 104 is shaped and sized to receive the semiconductor device. The opening 104 is defined, at least in part, by guide surfaces 106 (FIG. 2).

The carrier 100 also includes a pair of rollers 108. Each roller 108 is mounted to the body 102 at a respective one of the guide surfaces 106. The rollers 108 are positioned opposite each other at respective sides of the opening 104. As will be seen, the rollers are pivotably mounted to spring-loaded shafts 110, and are provided to hold the semiconductor device (not shown in FIGS. 1 and 2) in the opening 104.

The shafts 110 are each a part of a respective mounting mechanism 112 (FIG. 2) for mounting the respective roller 108. Each mounting mechanism 112 may include a respective channel 114 which extends into the body 102 from the opening 106. Each channel 114 may have received therein the respective shaft 110 and may also house a coil spring 116 to spring-load the shaft 110. The coil spring 116 may be provided to bias the shafts 110 and the rollers 108 toward the opening 104. The coil spring 116 may contact a proximal end 118 of the shaft 110 that it biases.

The respective roller 108 may be mounted to the distal end 120 of its respective shaft 110 by a pivot pin 122 that allows the roller 108 to pivot through a vertical arc. The rollers 108 may be elliptical, in the sense that the cross-sectional profile of the rollers (taken in a plane parallel to the length dimension of the shafts 110) may be entirely or partially elliptical. The elliptical or partially elliptical profile of each roller 108 has a longitudinal axis having a proximal end at which the roller 108 is mounted to the shaft 100. The longitudinal axis also has a distal end which is opposite to the proximal end of the longitudinal axis. In some embodiments, the roller 108 may have a lip 124 (best seen in FIG. 7) to contact a bottom edge of a semiconductor device (not shown in FIG. 7) to be received in the carrier 100. The lip is at the distal end of the longitudinal axis of the roller 108 and thus is at the opposite end of the roller 108 from the pivot pin 122.

Each roller 108 also has a slot 126 formed therein. The slot 126 runs along the longitudinal axis of the respective roller 108. Each mounting mechanism 112 also includes a respective slide pin 128 which is received within the slot 126 of the respective roller 108. Each slide pin 128 is free to travel within its respective slot 126 and in a respective pair of slide grooves 130 (only one slide groove of each pair shown in FIG. 2). Each roller 108 is mounted between the two slide grooves of its respective pair of slide grooves. In some embodiments, the slide grooves 130 may be inclined upwardly and inwardly relative to the opening 104, as illustrated in FIG. 2, so that a length direction of the slide grooves 130 is transverse to the length direction of the shafts 110. It will also be observed that the slide grooves 130 are adjacent the opening 104 in the body 102 of the carrier 100. The slot 126, slide pin 128 and slide grooves 130 are provided to guide the respective roller through a desired course of motion when the carrier receives the semiconductor device (not shown in FIG. 2).

The rollers 108 may be made of a suitable material that does not generate static electric charges. For example, the rollers may be made of friction-coated metal or of a thermoplastic resin such as Torlon® or Vespel®. The body 102 of the carrier 100 may be made of a material that is conventionally used for carriers used to transport semiconductor devices.

Figure 3:
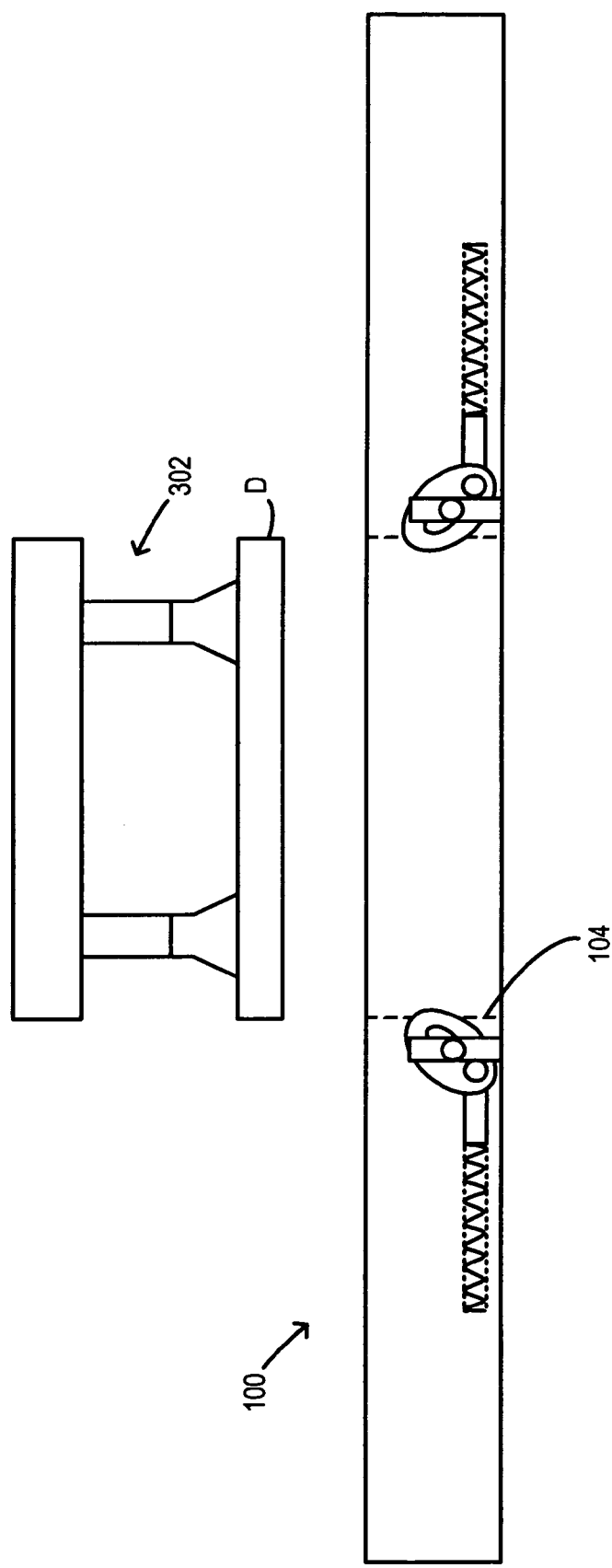
FIG. 3 is a view similar to FIG. 2, showing the carrier in juxtaposition with a semiconductor device to be received by the carrier.

FIG. 3 is a view similar to FIG. 2, showing a pick and place unit 302 positioned to insert a semiconductor device D into the opening 104 of the carrier 100.

Figure 4:
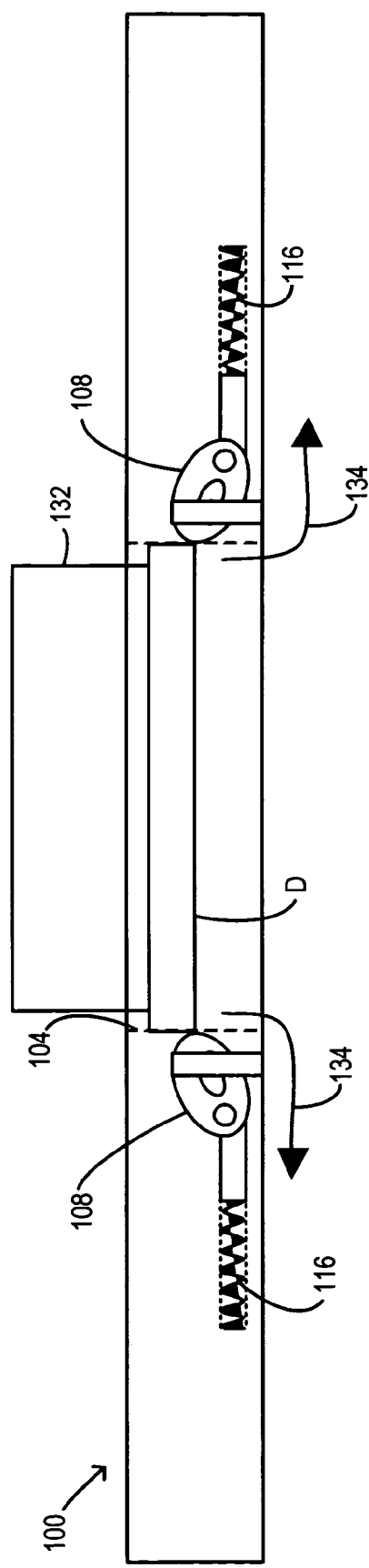
FIG. 4 is a view similar to FIGS. 2 and 3, showing the semiconductor device received by the carrier.

FIG. 4 is a view similar to FIGS. 2 and 3, showing the semiconductor device D received by the carrier 100. The semiconductor device D may be a packaged microprocessor, for example, or another type of integrated circuit device.

In accordance with conventional practices, the carrier 100 and the semiconductor device D may be engaged by a chuck (schematically indicated at 132) at a point in time after the device D has been placed in the opening 104. In accordance with some embodiments, the chuck forces the device D downwardly in the opening 104, thereby forcing the rollers 108 downwardly and apart (away from each other), as indicated by arrows 134, so that the device D is engaged between the rollers 108 and held between the rollers 108 by the spring force of the coil springs 116. Further details of the motion of the rollers will be described below. The rollers 108, together with their mounting mechanisms 112, constitute a holding mechanism to hold the semiconductor device D in the opening 104.

Figure 5:
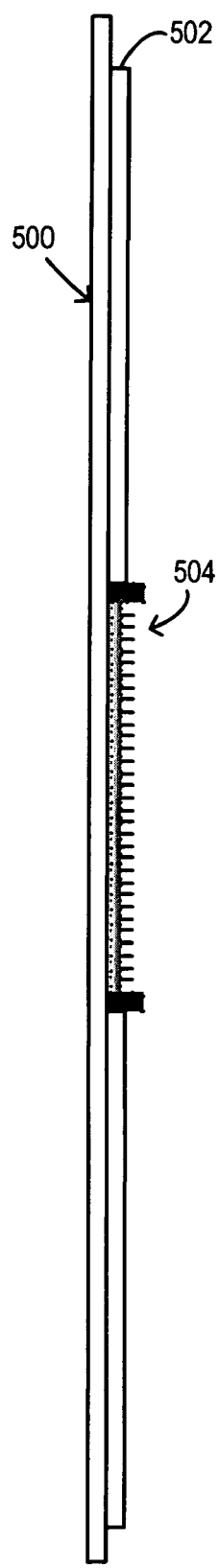
FIG. 5 is a schematic side cross-sectional view showing a conventional test fixture to which the semiconductor device may be interfaced.

FIG. 5 is a schematic side cross-sectional view showing a conventional test fixture 500 to which the semiconductor device may be interfaced. The test fixture 500 may be of the type referred to as a test interface unit (TIU). For example, the test fixture 500 may be of the type used in the "Summit ATC" test handler manufactured by Delta Design, Inc., Poway, Calif. The test fixture 500 includes a seal block 502 and a contactor 504 having pins to which the semiconductor device is to be interfaced for test purposes.

Figure 6:
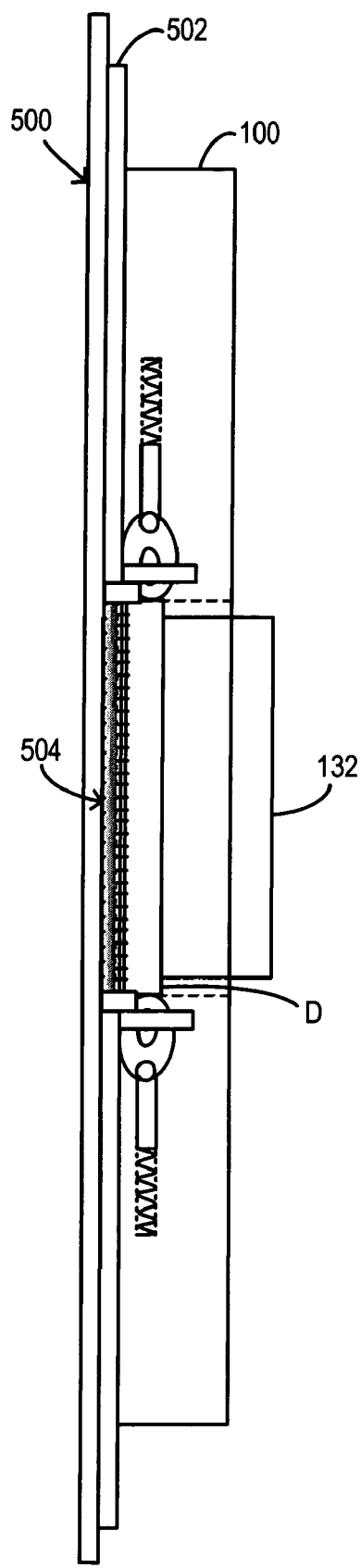
FIG. 6 is a view similar to FIG. 5, showing the semiconductor device (while held in the carrier) interfaced to the test fixture of FIG. 5.

FIG. 6 is a view similar to FIG. 5, showing the semiconductor device D held by the chuck 132 in a position such that the semiconductor device D is interfaced to the contactor 504 of the test fixture 500 while the semiconductor device D is held in the carrier 100.

Figure 7:
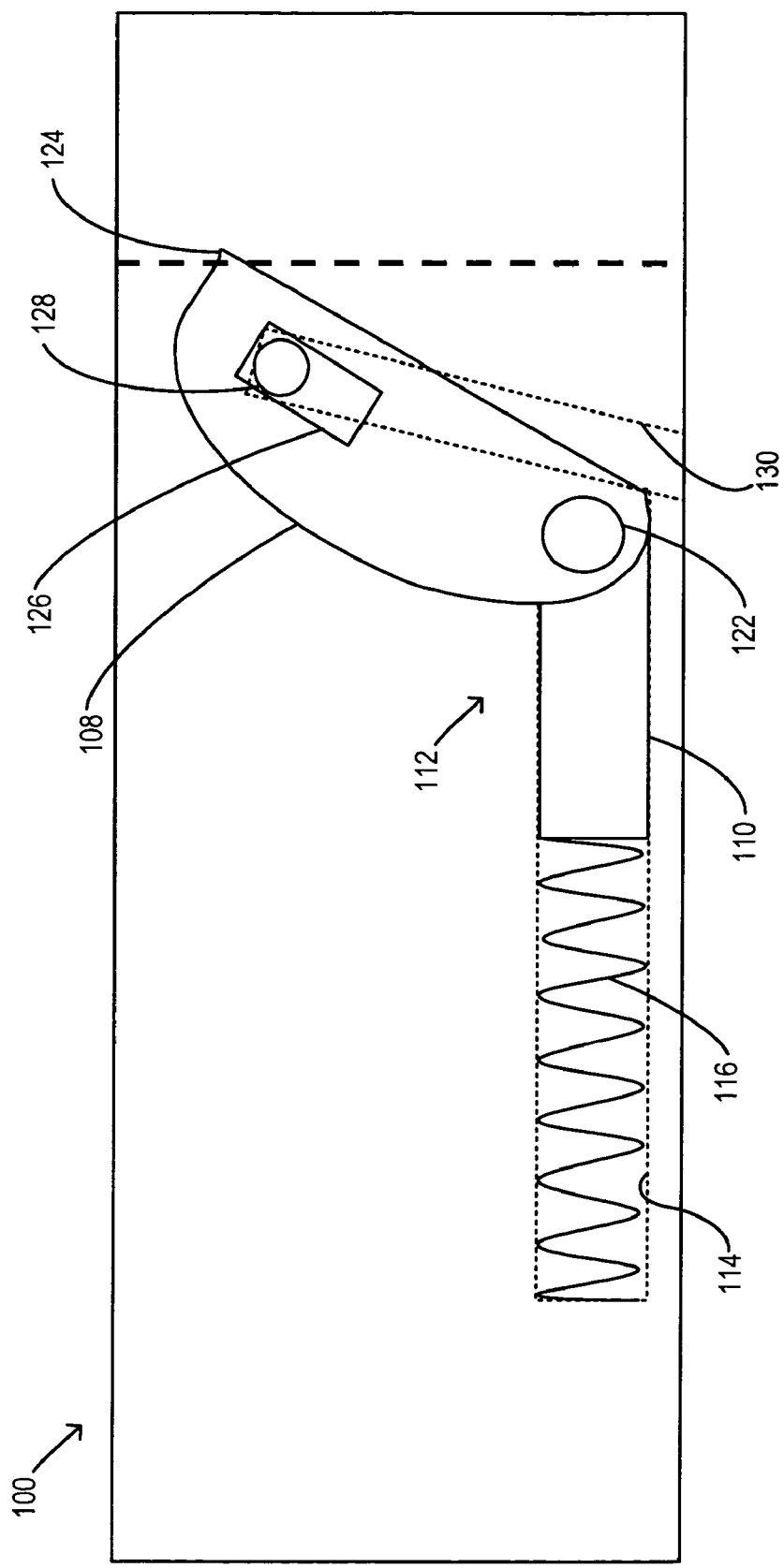
FIG. 7 is a schematic side cross-sectional view showing details of the carrier of FIGS. 1-4.

FIG. 7 is a schematic side cross-sectional view showing some details of the carrier 100. In particular, FIG. 7 shows one of the rollers 108 and its associated mounting mechanism 112 in a condition in which no semiconductor device is present and the roller is in an extended or "relaxed" position. It will be noted that due to the interaction of the coil spring 116, the shaft 110, the pivot pin 122, the slide pin 128 and the slide groove 130, the roller 108 is inclined upwardly relative to the shaft 110.

Figure 8:
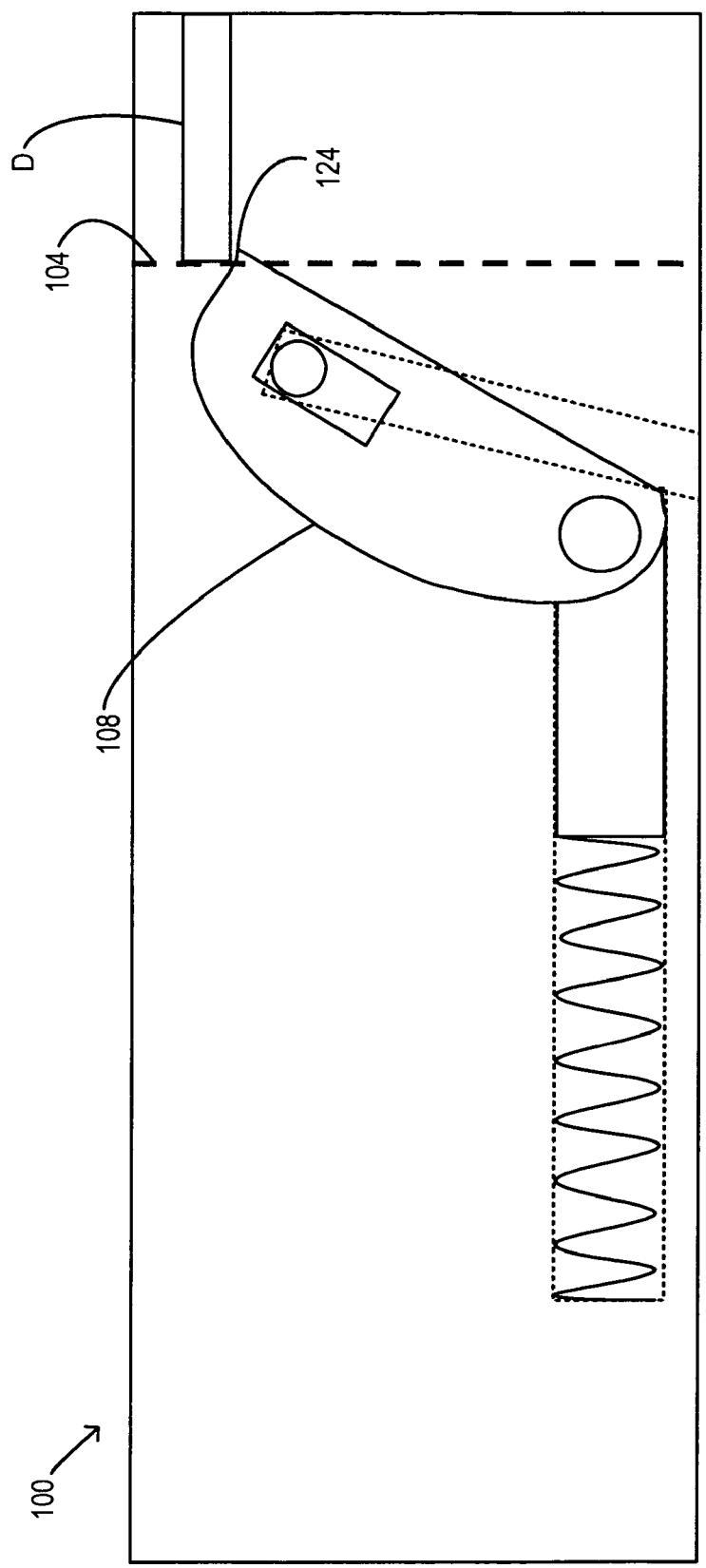
FIG. 8 is a view similar to FIG. 7, showing the carrier in juxtaposition with the semiconductor device.

FIG. 8 is a view similar to FIG. 7, showing the semiconductor device D, which has been placed in the opening 104 of the carrier 110, by, e.g., a pick and place unit, which is not shown. At this point the semiconductor device D may rest on the lip 124 of the roller 108.

Figure 9:
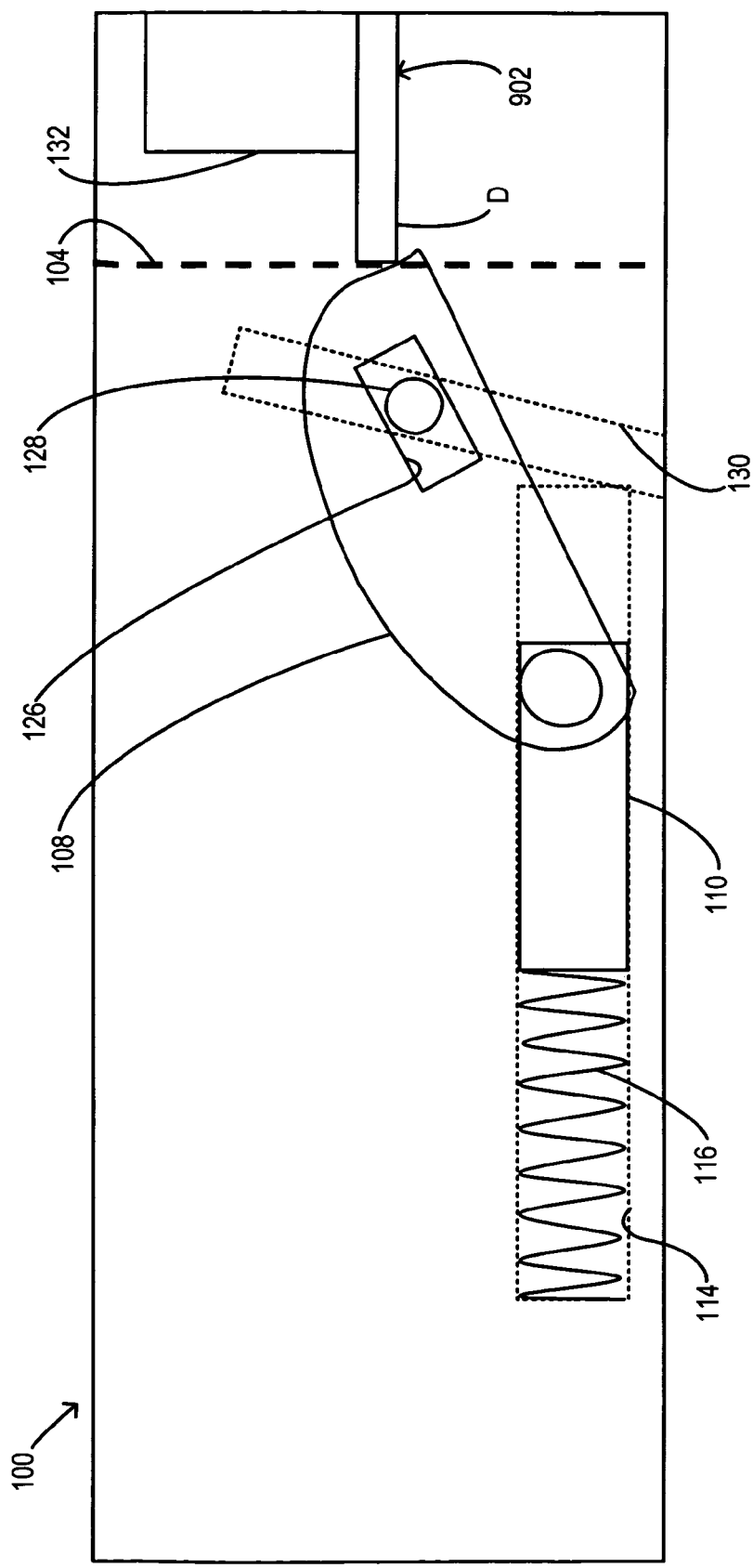
FIG. 9 is a view similar to FIGS. 7 and 8, showing a subsequent stage in the handling of the semiconductor device.

FIG. 9 is a view similar to FIGS. 7 and 8, showing the carrier 100 and the semiconductor device D at a point in time when the carrier 100 and the semiconductor device D have been engaged by the chuck 132. (To simplify the drawing, only the portion of the chuck 132 which contacts the semiconductor device D is shown. However, it should be appreciated that the chuck may have other members which are not shown and which engage the bottom or other portions of the carrier 100.) As a result of the downward force applied by the chuck 132 to the semiconductor device D, the semiconductor device D is caused to travel downwardly in the opening 104 of the carrier 100. Consequently, the roller 108 is caused to pivot downwardly, and camming action from the roller 108 drives the shaft 110 in the channel 114 away from the opening 104, thereby compressing the coil spring 116. As this occurs, the slide pin 128 travels in the slide groove 130 and may also travel in the slot 126 to guide the roller 108.

In the condition shown in FIG. 9, the spring force of the coil spring 116 and of the other coil spring (not shown in FIG. 9) associated with the opposed roller (not shown in FIG. 9) holds the semiconductor device D between the rollers 108 in the opening 104 without substantially contacting the bottom surface 902 of the semiconductor device D. Thus, there is no need to prescribe "keep out" zones in which pins (not shown) are not allowed on the bottom surface of the semiconductor device D. With this arrangement, the pin count on the semiconductor device D may be enhanced, or, viewed from another perspective, semiconductor devices that lack keep out zones may nevertheless be handled by the test equipment.

In the condition shown in FIG. 9, a robot or other handling device may, by means of the chuck 132, maneuver and transport the semiconductor device D and the carrier 100 from a staging tray or table (not shown) to the test fixture.

Figure 10:
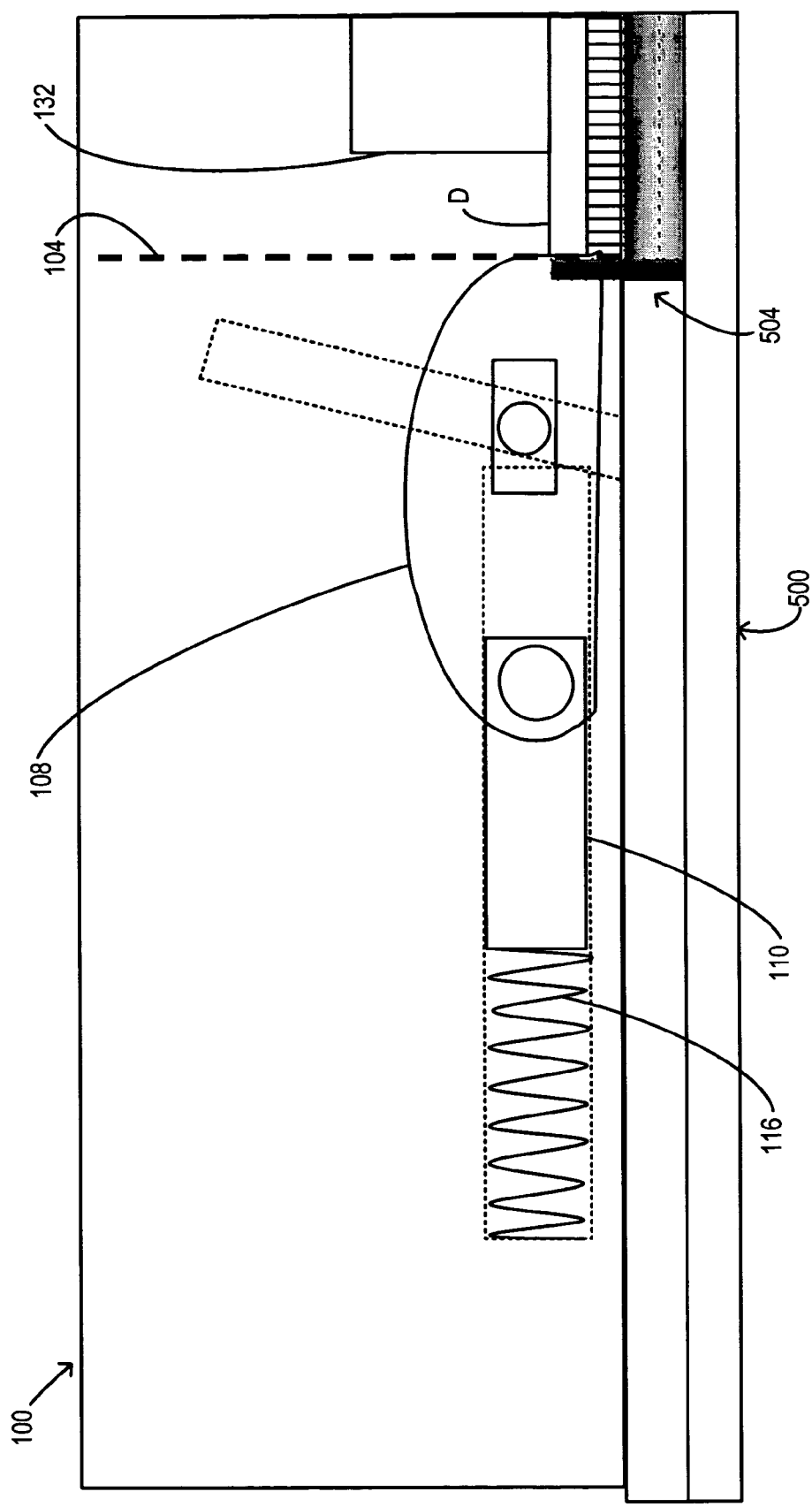
FIG. 10 is a view similar to FIGS. 7-9, showing a subsequent stage in the handling of the semiconductor device.

FIG. 10 shows a subsequent stage of the testing process, in which the semiconductor device D is brought into initial contact with the contactor 504 of the test fixture 500. (For ease of comprehension, the carrier 100 and semiconductor device D are still shown in a horizontal orientation in FIG. 10, although in practice the same may have been maneuvered into a vertical orientation to match the orientation of the test fixture 500, which is also shown as horizontal rather than its customary vertical orientation.)

In the condition of FIG. 10, the chuck 132 has driven the semiconductor device D to the bottom of the opening 104 of the carrier 100, forcing the roller 108 to pivot further (so as to be essentially aligned with the shaft 110), and further compressing the coil spring 116.

Figure 11:
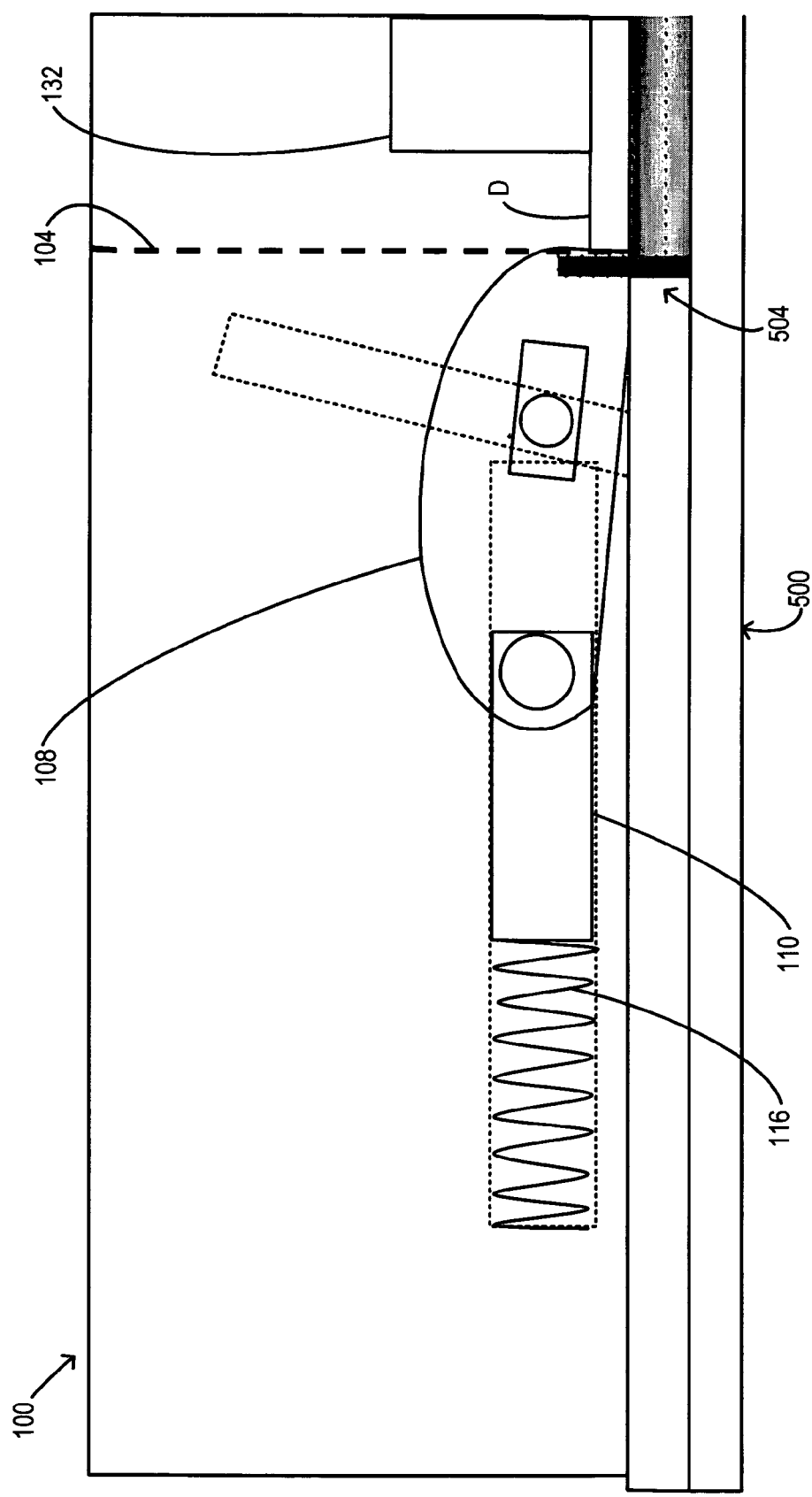
FIG. 11 is a view similar to FIGS. 7-10, showing a subsequent stage in the handling of the semiconductor device.

FIG. 11 shows a further stage of the testing operation, in which the semiconductor device D is fully engaged with the contactor 504 of the test fixture 500. In this condition, the testing of the semiconductor device D may proceed. In accordance with conventional practices, the chuck 132 may include temperature control components (not separately shown) so that the semiconductor device D may be maintained at an appropriate temperature or temperatures while test signals are applied to the semiconductor device D from the test fixture 500.

In the condition shown in FIG. 11, the roller 108 has been driven still further, so that it is slightly past the point of being aligned with the shaft 110.

When the testing of the semiconductor device D is complete, the chuck 132 is moved away from the test fixture 500 to allow the semiconductor device D to be released from the test fixture 500. The pins (not separately shown) of the contactor 504, having been compressed by engagement of the semiconductor device D with the contactor 504, may urge the semiconductor device D back to the position shown in FIG. 10. As the chuck continues to move away from the bottom of the opening 104 in the carrier 100, the opposed rollers 108, urged by the springs 116 and guided by the inwardly inclined slide grooves 130, pivot upwardly and push the semiconductor device D upwardly to the position shown in FIG. 9 at which the semiconductor device is again held between the opposed rollers. The carrier 100 and the semiconductor device D may now be maneuvered and/or transported by the chuck 132 to an output tray or table (not shown). At the output table, the chuck may release the carrier and the semiconductor device, and the latter may then be removed from the carrier by the pick and place unit.

As used herein and in the appended claims, "receiving" the semiconductor device D within the opening 104 of the carrier 100 includes the semiconductor device D being moved within the opening 104.

The bias arrangement for the shaft 110 need not include a coil spring 116. Alternatively, for example, another type of spring such as a leaf spring or torsion spring may be used, or the biasing force may be applied pneumatically.

The elliptical rollers 108 are one example of grip elements that may be employed to hold the semiconductor device therebetween, but other types of members (e.g., non-pivoting plungers) may alternatively be used as grip elements.

In some embodiments, the mounting mechanism for each roller may include a click-and-hold feature to hold each roller in a position for holding the semiconductor device between the rollers.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A carrier for a semiconductor device, comprising:
    a body having an opening formed therein to receive the semiconductor device;
    a pair of grip elements to hold the semiconductor device therebetween in the opening;
    a first mounting mechanism to movably support a first one of the grip elements at a first side of the opening; and
    a second mounting mechanism to movably support a second one of the grip elements at a second side of the opening that is opposite the first side of the opening;
    wherein:
        the grip elements are elliptical rollers;
        each roller has a longitudinal axis, and is mounted to its respective one of said mounting mechanisms by a respective pivot pin at a proximal end of the longitudinal axis, said pivot pin to allow said each roller to pivot relative to a shaft that is part of said respective one of said mounting mechanisms; and
        each of said mounting mechanisms includes a respective bias component to bias said shaft toward said opening.

2. The carrier of claim 1, wherein each bias component is a coil spring.

3. The carrier of claim 1, wherein each of said rollers has a slot formed therein, said slot running along said longitudinal axis of said each roller.

4. The carrier of claim 3, further comprising a pair of slide pins, each slide pin to travel in the slot of a respective one of said rollers, each slide pin also to travel in a respective slide groove adjacent said opening, each of said slide grooves having a length direction that is transverse to a length direction of said shafts.

5. A carrier for a semiconductor device, comprising:
    a body having an opening formed therein to receive the semiconductor device; and
    a holding mechanism to hold the semiconductor device in the opening, the holding mechanism including a pair of opposed elliptical rollers to engage the semiconductor device therebetween, each of said rollers pivotally mounted to a respective spring-loaded shaft;
    wherein:
        each of said rollers is guided by a respective slide pin that travels in a respective slide groove adjacent to said opening and oriented transversely relative to said shaft; and
        each roller has a respective slot therein, said respective slide pin traveling in said slot.

6. The carrier of claim 5, wherein a respective longitudinal axis of each of said rollers is inclined relative to said shaft to which said each roller is mounted.

7. The carrier of claim 6, wherein said slot in each roller is aligned with the longitudinal axis of said each roller.

8. The carrier of claim 5, wherein each of said shafts is spring-loaded by a respective coil spring.

\* \* \* \* \*